(12) United States Patent
Tarng

(10) Patent No.: US 7,079,612 B2
(45) Date of Patent: Jul. 18, 2006

(54) FAST BIT-ERROR-RATE (BER) TEST

(75) Inventor: Tony Tarng, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1054 days.

(21) Appl. No.: 10/060,755

(22) Filed: Jan. 29, 2002

(65) Prior Publication Data

US 2003/0142737 A1 Jul. 31, 2003

(51) Int. Cl.
*H04B 1/10* (2006.01)
*G06F 11/00* (2006.01)
*G01R 27/28* (2006.01)

(52) U.S. Cl. .................. 375/354; 714/704; 702/117
(58) Field of Classification Search ............. 375/354, 375/226, 224, 355, 357; 714/704, 715, 712, 714/738; 702/117
See application file for complete search history.

(56) References Cited

U.S. PATENT DOCUMENTS

| 6,661,836 B1* | 12/2003 | Dalal et al. ............. 375/226 |
| 6,820,234 B1* | 11/2004 | Deas et al. ............. 714/814 |
| 2002/0073374 A1* | 6/2002 | Danialy et al. ......... 714/738 |
| 2003/0229466 A1* | 12/2003 | Garcia .................. 702/117 |

* cited by examiner

*Primary Examiner*—Khai Tran
(74) *Attorney, Agent, or Firm*—Ronald O. Neerings; Wade James Brady, III; Frederick J. Telecky, Jr.

(57) ABSTRACT

A bit-error-rate (BER) test is a crucial test for wireless devices to pass, since a device with a high BER does not perform at its best. BER tests are both costly and difficult to perform due to a delay incurred by the device under test (DUT) 215 and the testing hardware that is variable in nature. Because the delay is variable, a hardware BER test that can compensate for the delay is difficult to build and a software BER test that can easily compensate for the delay is very slow. The present invention provides a method and apparatus that can compensate for the variable delay. By doing so, a hardware BER test, which is considerably faster than a software BER test, is easily implemented.

30 Claims, 3 Drawing Sheets

FAST BIT-ERROR-RATE (BER) TEST

FIELD OF THE INVENTION

This invention relates generally to digital testing, and particularly, testing bit-error-rates in digital communications systems.

BACKGROUND OF THE INVENTION

Digital testing is a necessary component of the manufacturing of digital devices. Testing helps in ensure the functionality of devices while it reduces the probability of shipping faulty products, which would result in a return and reduction in customer satisfaction. As a result, digital testing is performed on almost all digital devices. While digital testing is a necessary step of the manufacturing process, it is in general slow. Therefore, testing can add a significant amount of time and expense to the manufacture of a digital device.

A seemingly ubiquitous device in today's world is a wireless communications device. From cellular telephones, cordless phones, wireless communications and data networks, pagers, etc., wireless devices have become a part of everyone's way of life. For these wireless devices, a crucial test that they all should undergo is a bit-error-rate (BER) test. The BER test determines the rate of faulty bits to transmitted bits. A wireless device with a high BER will sound poorly (if it is a communications device) or perform poorly with a low data rate (if it is a data device).

The BER test is achieved by pushing a known data stream through the wireless device, typically via the antenna, and then comparing the data stream prior to a decoding stage with a copy of the known data stream. Errors, if any, are counted. If the BER for the device exceeds a predetermined amount, the device is deemed as having failed the BER test. The BER test can and is performed on wired devices as well.

A difficulty associated with performing the BER test is aligning the known data stream with the data stream from the device prior to a decoding stage. This is due to delays introduced into the test system by the testing hardware and the device itself. To make the matters more difficult, the delays can vary depending on different test systems and different devices. Therefore, there is not a constant amount of delay that can be readily compensated.

One common way to perform the BER test is to save the data stream produced by the device into memory and then the two data streams are compared via a software program. The software program performs a correlation between the two data streams to synchronize the two streams prior to comparing them. Unfortunately, a software implementation of the BER test is extremely slow. Its inherent lack of speed tends to either shorten the BER test being performed or to reduce the number of devices tested. Neither is a viable option for producing a device with low failure rates.

Another way to perform the BER test is to use hardware to perform the comparison. However, due to the varying delay between test systems and devices, it is extremely difficult to develop a hardware based BER test system that is flexible to test devices with varying delays.

A need has therefore arisen for a BER test system that can accommodate the varying delays seen between different test systems and devices and at the same time provide a short testing time that will be conducive to the more complete testing of a larger number of devices.

SUMMARY OF THE INVENTION

In one aspect, the present invention provides a method for synchronizing two data streams wherein the first data stream has a delay, the method comprising: setting a first setting a first data stream generator to output a first periodic pulse stream with its period equal to first period, T1, producing an output after the delay, setting a second data stream generator to output a second periodic pulse stream with its period equal to second period, T2, wherein second period, T2, is not equal in duration to first period, T1, detecting a time when a pulse of the delayed first pulse stream and a pulse of the second pulse stream occurs simultaneously, changing the period of the second pulse stream to be equal to first period, T1, and starting the generation of the two data streams.

In another aspect, the present invention provides a method for comparing two data streams wherein one data stream is propagated through hardware and has a delay, the method comprising: synchronizing the start of the two data streams, wherein the synchronizing step comprising: setting a first data stream generator to output a first periodic pulse stream with its period equal to first period, T1, producing an output after the delay, setting a second data stream generator to output a second periodic pulse stream with its period equal to second period, T2, wherein the second period, T2, is not equal in duration to the first period, T1, detecting a time when a pulse of the delayed first pulse stream and a pulse of the second pulse stream occurs simultaneously, changing the period of the second pulse stream to be equal to first period, T1, and starting the generation of the two data streams, and comparing the two data streams, after starting the two data streams.

The present invention provides a number of advantages. For example, use of a preferred embodiment of the present invention permits a fast, hardware-based test of the bit-error-rate of a device due to its ability to provide compensation for the variable delay introduced by the test system and the device.

Also, use of a preferred embodiment of the present invention the use of existing BER testing hardware to be used with minor modifications, permitting an easy migration to a test system using the present invention.

Additionally, a preferred embodiment of the present invention has applicability to the testing of any device requiring a BER test on any test hardware fixture.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

Figure 1:
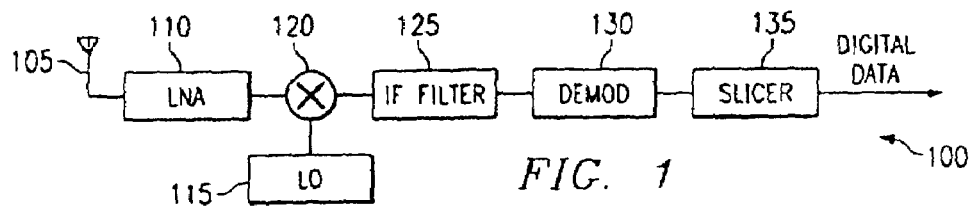
FIG. 1 illustrates a block diagram of a receive path of a typical wireless device.

Referring now to FIG. 1, a block diagram illustrates an exemplary signal receive path 100 of a wireless device. The receive path 100 of a wireless device is responsible for receiving a wirelessly transmitted signal and converting it into a form that is ready for processing by the wireless device. Traditionally, wireless devices have used radio frequency (RF) signals for transmission. However, many of today's wireless devices are using microwaves, light beams, and laser beams. For discussion purposes, the wireless devices in these specifications will be limited to using RF signals, although the present invention has application to the BER testing of wireless devices using other communications media, such as the ones listed above. The present invention also has applicability to the BER testing of wired devices as well. Therefore, the present invention should not be construed as being limited solely to testing wireless RF devices.

The RF signal is detected by an antenna 105 that, in turn, provides the signal in the form of electrical current to a low noise amplifier (LNA) 110. The LNA 110 provides amplification for the signal while at the same time introducing a minimal amount of noise to the signal. A mixer 120 mixes the amplified signal with a carrier frequency produced by a local oscillator (LO) 115. The effect of the mixer 120 is to extract a modulated data signal from the amplified signal. Of course, there are types of RF based wireless devices that do not use carrier frequency modulation, such as spread spectrum devices and multi-carrier modulated devices, and they will have a correspondingly different receive path. However, for simplicity's sake, the discussion is limited to carrier frequency modulated wireless devices. The present invention, however, is not limited to only carrier frequency modulated wireless devices and the discussion should not be construed as to limit the present invention to such devices.

After the data signal has been demodulated from the amplified signal, the data signal is filtered by an IF filter 125. The function of the IF filter is to permit only the desired data to pass further into the receive path of the wireless device and extract as much noise as possible from the data signal. A demodulator 130 extracts the actual data stream from the modulated data stream and a slicer 135 converts the analog data stream into a digital data stream. The digital data stream then receives digital signal processing and eventually becomes data that is in a form that is usable by digital devices that may be coupled to the wireless device.

To perform a BER test on a wireless device, the device to be tested, commonly referred to as the device under test (DUT) is placed in a test fixture and a digital test sequence is modulated and presented to the device at a point in the device's receive path after the antenna 105 but prior to the LNA 110. The test is then performed when a copy of the test sequence is compared with the output of the slicer 135. The comparison compares the original test sequence with the digital data output of the slicer 135. If there were no errors introduced by the device, then the comparison would be exact. If errors were introduced by the device, then differences would exist between the original test sequence and the digital data output of the slicer 135. The differences would be counted and an BER determined.

Figure 2A:
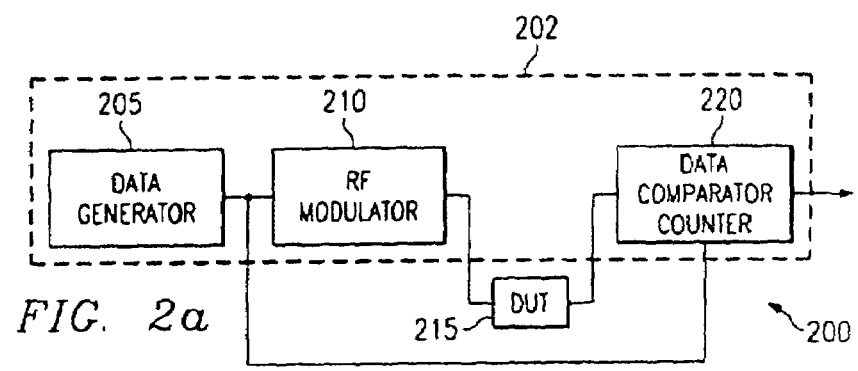
FIG. 2a illustrates a block diagram of a bit-error-rate testing system.
Figure 2B:
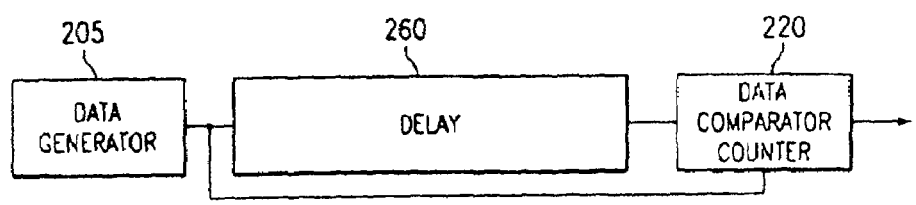
FIG. 2b illustrates a delay introduced by the test system and the device under test.

Referring now to FIG. 2a, a block diagram illustrates an exemplary test system 200 for performing a BER test for a wireless device. The test system 200 may be thought as being made up of two major parts, the first part is the actual test hardware 202 and the second is the device under test (DUT) 215. The test hardware 202 comprises a data generator 205, an RF modulator 210, and a data comparator/counter 220. The data generator 205 is responsible for generating the test pattern and the RF modulator 210 modulates the test pattern with a carrier frequency. The RF modulator 210 may be thought of as a device that converts the test pattern into an RF signal that is similar in form to what the actual RF device would actually receive over-the-air were it in normal operations.

However, to minimize potential sources of error, it is preferred that the transmission of the test signal from the RF modulator 210 to the DUT 215 be over a wired connection. The test signal produced by the RF modulator 210 would be identical to what the DUT 215 normally receives over-the-air, except that it is provided to the DUT 215 by a wired connection rather than via an antenna.

The data comparator/counter 220 is responsible for actually performing the test and to record the results of the test. One input of the data comparator/counter 220 is coupled to the output of the DUT 215. As discussed previously, the preferred point to extract the output from the DUT 215 is at the output of the data slicer. A second input of the data comparator/counter 220 is coupled to the data generator 205. The data generator 205 is capable of generating the test pattern for testing the DUT 215 and producing the same test pattern for use in comparing the test pattern with the output of the DUT 215.

The data comparator/counter 220 compares the two test patterns, preferably by using a simple binary exclusive-or (XOR) operation. The XOR operation is well known to those of ordinary skill in the art of the present invention. Basically, if two binary values match, the output of the XOR operation is a zero while if two binary values differ, the output of the XOR operation is a one. The data comparator/counter 220 counts the outputs of the XOR operation and simply divides the count by the number of binary values in the test pattern to produce a BER for the DUT 215.

However, the test pattern generated by the data generator 205 as it goes through the RF modulator 210 and the DUT 215 accumulates delays. The delays may be due in part to processing delays (modulation, encoding, demodulation, decoding, etc.) and propagation delays (through the electrical conductors, wires, etc.). Additionally, due to the fact that different devices operate at slightly different frequencies, the delays imparted onto the test pattern are most likely not the same for different test hardware and different DUT.

Referring now to FIG. 2a, a block diagram illustrates the delay imparted onto the test pattern due to the test hardware and the DUT according to a preferred embodiment of the present invention. As discussed previously, a delay 260 is imparted onto the test pattern generated by the data generator 205 by the RF modulator 210 and the DUT 215. The delay 260 is due to processing and propagation delays imparted by these units. However, notice that data comparator/counter 220 receives at its second input a copy of the same test pattern that is being sent through the DUT 215. This test pattern does not go through any functional units, therefore, it arrives at the data comparator/counter 220 essentially incurring no delays. With one test pattern incurring a delay of varying amount and another test pattern incurring no delay, the simple comparison of the two test patterns will produce an inaccurate BER.

With a delay that changes each time a different wireless device is placed into the test hardware or with different test hardware, it is difficult to compensate for the delay when using a hardware BER test. A software BER test can readily support the varying delay. A software BER test can simply store the test pattern as it is generated by the data generator and as it comes out of the wireless device, perform a correlation on the two patterns to find the starting points of the two patterns and then perform a comparison of the two patterns.

Figure 3:
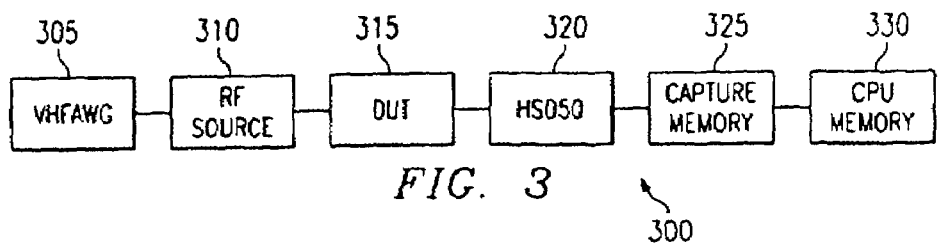
FIG. 3 illustrates a commonly used configuration for a software based BER testing system.

Referring now to FIG. 3, a block diagram displays a software BER test system 300. A data generator, such as a very high frequency arbitrary waveform generator (VHFAWG) 305, can be used to generate the test pattern. It is preferred that the test pattern be a fair representation of all possible inputs to the wireless device. A pattern that exhibits these characteristics is a pseudo-random sequence. Pseudo-random sequences are well understood by those of ordinary skill in the art of the present invention. The test pattern, as generated by the VHFAWG 305 is provided to an RF source 310 that is responsible for modulating the test pattern, providing any encoding, amplification, etc. so that the signal being provided to the wireless device is identical to a signal that the wireless device would receive over-the-air in normal everyday use.

The signal produced by the RF source 310 is sent to the device under test (DUT) 315 via a wired connection. As stated previously, it is preferred to use a wired connection to minimize any errors from sources other than the DUT 315 itself. The output of the DUT 315 is then provided to a piece of automated test equipment (ATE), such as a High-Speed Digital 50 Mhz (HSD50) 320. The function of the HSD50 320 is to generate/compare digital patterns with a maximum frequency of 50 Mhz, hence its name. In a software BER test, the HSD50 320 is used to digitally capture the output of the DUT 315.

The captured output of the DUT 315 is stored in a capture memory 325 and then moved to a CPU memory 330 where it can be compared with a copy of the test pattern already stored in the CPU memory 330. A software program, executing in the CPU memory 330, performs a correlation between the captured output of the DUT 315 and the stored test pattern to determine the starting point of both patterns. Once the starting points are determined, the software program performs a comparison of the individual bits and counts the instances where the bits are different. This count is used to generate the BER for the DUT 315.

Unfortunately, a software BER test can be several orders of magnitude slower than a hardware BER test. As a result, software BER tests tend to be shorter, using a relatively short test pattern, resulting in a less than complete test.

Figure 4:
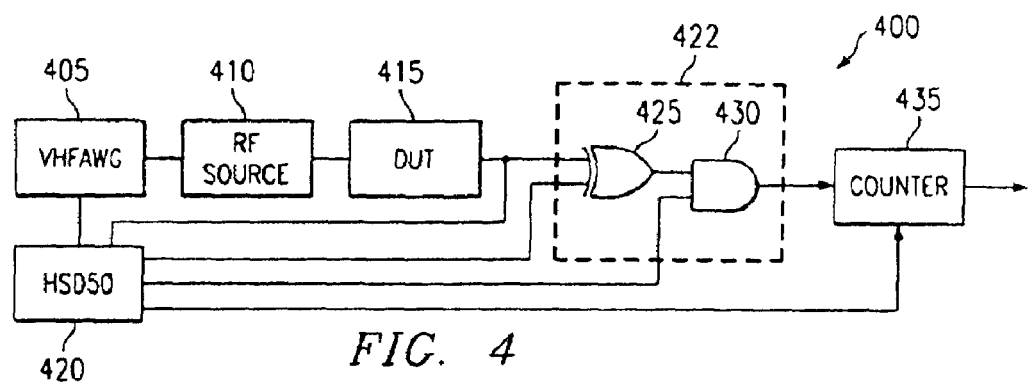
FIG. 4 illustrates a testing system for testing the bit-error-rate of a device according to a preferred embodiment of the present invention.

Referring now to FIG. 4, a block diagram illustrates a hardware BER test system 400 with built-in compensation for varying delay according to a preferred embodiment of the present invention. The test system 400 uses essentially the same test hardware that the software BER test system 300 present in FIG. 3 uses, with minor additional programming. In fact, according to a preferred embodiment of the present invention, the test system 400 does require the CPU that a software BER test system would require. Therefore, it is easy to implement the test system 400 without incurring additional test hardware costs and it is possible to even reduce the total hardware count by eliminate digital capture memory module 325 (from the software BER test system displayed in FIG. 3).

A test pattern generator 405, such as a VHFAWG, the same type of device as described in FIG. 3, is used to provide the test pattern. The test pattern is converted to a radio frequency signal by an RF source 410, again similar or the same as described in FIG. 3. The radio frequency signal is then delivered to a device under test (DUT) 415 via a wired connection.

The output of the DUT 415 is coupled to both a piece of automated test equipment (ATE) 420 (again, the ATE could be the HSD50, such as one described in FIG. 3) and some combinatorial logic 422. The combinatorial logic is used both to compare the test patterns and to enable/disable the output of the test. According to a preferred embodiment of the present invention, the combinatorial logic 422 comprising an exclusive-or (XOR) gate 425 and a negative-and (NAND) gate 430. The XOR gate 425 is used for the comparison while the NAND gate 430 performs the enable/disable chores. The output of the NAND gate 430 is provided to a counter 435 whose task is to simply increment its counter each time its input is high when it is clocked.

Also coupled to the ATE 420 is the data generator 405. The coupling between the ATE 420 and the data generator 405 permits the ATE 420 to issue commands to the data generator 405. For example, the ATE 420 can tell the data generator 405 to begin generating the test pattern.

Notice once again, that no additional test hardware is required for the hardware BER test when compared to the software BER test of FIG. 3. Additionally, the additional combinatorial logic 422 and the counter 435 are simply two small integrated circuits that cost very little and may already be present in most test hardware. For example, the counter 435 may be already an integrate part of the ATE 420, therefore, there is no need to construct it on the test fixture. When compared with the high speed CPU required to perform the correlation and the counting in the software BER test, the overall hardware BER test has significantly smaller costs and faster speed.

Up until now, the problem with using a hardware BER test is the compensation for the varying delay. The time between the output of the pattern generator 405 and the output of the DUT 415 may be different for different wireless devices inserted into the test system and for different test systems themselves. Compensation must be provided for the delay prior to the comparison of the output of the DUT 415 and a copy of the original test pattern can be performed.

Figure 5:
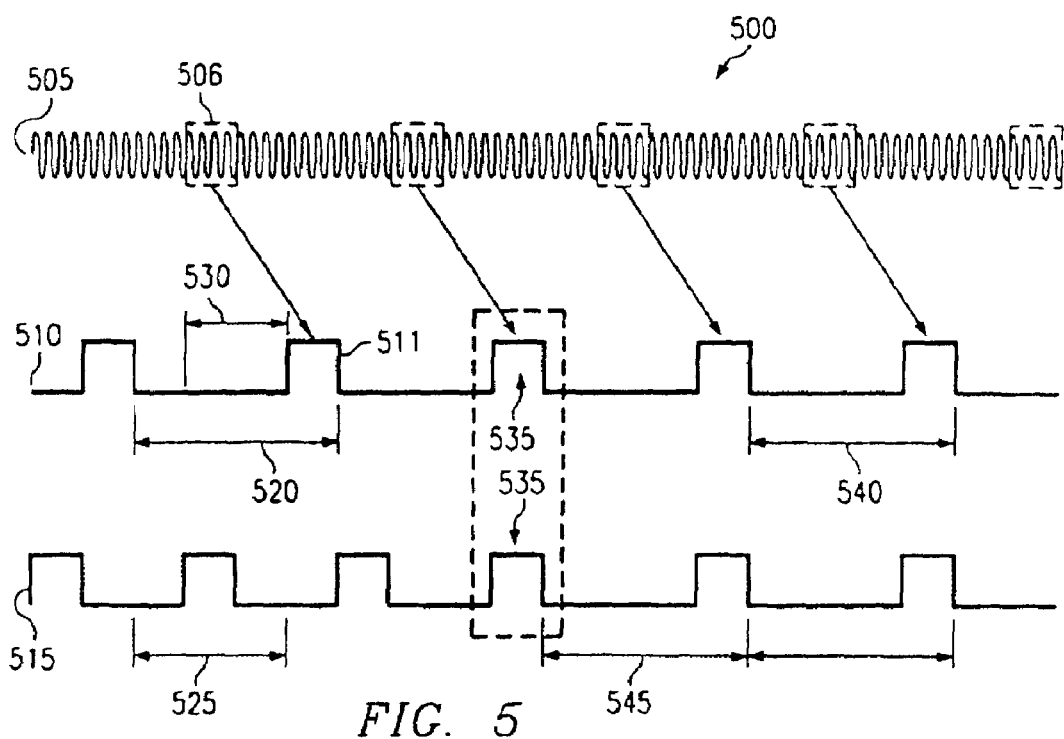
FIG. 5 illustrates a timing diagram of various data streams in the testing system for testing the bit-error-rate of a device according to a preferred embodiment of the present invention.

Referring now to FIG. 5, three curves display the timing diagram 500 of various data streams in a hardware BER test system according to a preferred embodiment of the present invention. A first curve 505 displays the output of the pattern generator 405. According to a preferred embodiment of the present invention, the output of the pattern generator is a modulated waveform where the frequency of waveform represents the binary value the waveform is carrying. However, the output of the pattern generator 405 may be an unmodulated digital waveform. As shown in the first curve 505, a majority of the output of pattern generator 405 is a low binary value and is represented with a single frequency waveform. Portions of the first curve 505 are highlighted (such as highlight 506 and others) to represent a high binary value. A second curve 510 represent the output of the DUT 415. The second curve 510 is shown in binary, unmodulated form. The output of the DUT 415 shown is an accurate representation of its input, the first curve 505, with no errors introduced by the DUT 415. However, if the DUT 415 were to introduce bit-errors into the signal, the second curve 510 would display the errors. A third curve 515 represents the output of the ATE 420.

Notice that there is a time lag between when a pulse appears on the first curve 505, for example, highlight 506, and when the second curve 510 displays the pulse (highlight 511). The time lag is the delay (shown as interval 530) imparted onto the waveform by the RF source 410 and the DUT 415 as it passes through those components. This delay 530 is the delay that must be determined and compensated prior to calculating the BER of the wireless device. According to a preferred embodiment of the present invention, in order to provide an adequate test of the BER, the test pattern should be long, on the order of tens of thousands of bits long. Notice that with a long test pattern and test hardware and wireless devices of reasonable performance, the delay 530 is expected to be shorter in duration than a single period of the test pattern. In fact, the delay 530 is typically much shorter than a single period of the test pattern.

The timing diagram 500 displays the curves for a time period immediately before and after the delay has been determined and compensated. Let the data generator 405 be configured to generate a periodic pulse (period of T1) with the same period as the test pattern (displayed in the second curve as interval 520). Let the ATE 420 be configured to generate a periodic pulse (period of T2) with a period that is less than the period of the test pattern (displayed in the third curve as interval 525). The ATE 420 monitors the output of the DUT 415 and compares it with its own output.

Since the period of the output of the ATE 420 is less than the period of the output of the data generator 405, the pulses will continually move towards each other until at one moment in time, the two pulses will line up (highlight 535). When the pulses on the two curves (510 and 515) line up, the ATE 420 detects the pulses lining up and changes the period of its own period pulse to be equal to the period of the test pattern (T1). This is displayed in the third curve 515 as interval 545. The period of the output of the DUT 415 continues to be T1, therefore, the output of the DUT 415 and the output of the ATE 420 are now synchronized.

With the output of the DUT 415 and the output of the ATE 420 synchronized, the delay 530 imparted onto the test pattern by the test hardware and the DUT 415 has been compensated and the BER test can begin.

Figure 6:
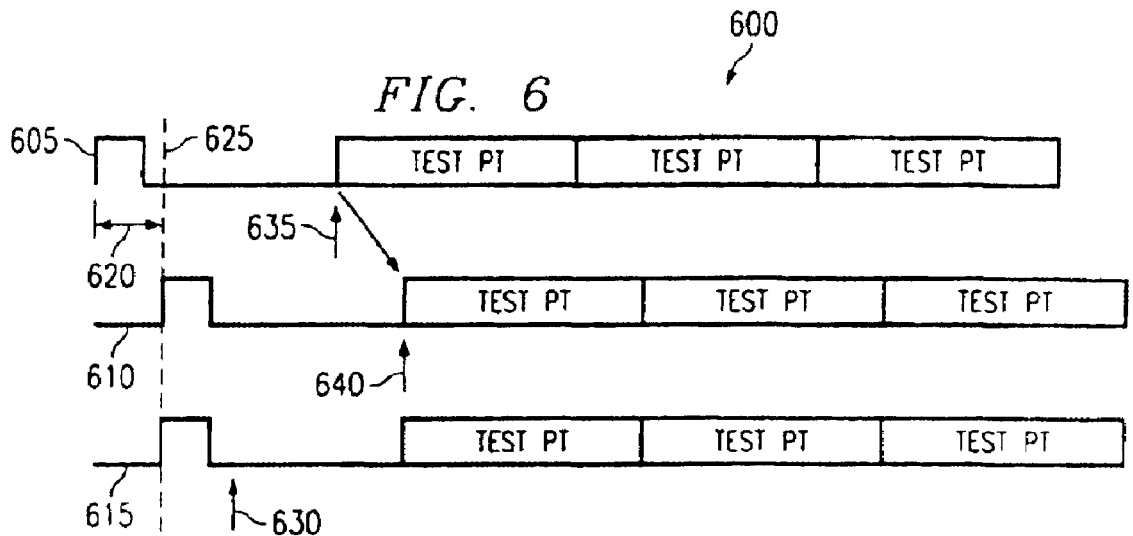
FIG. 6 illustrates a timing diagram of various data streams in a hardware BER test system and how the synchronization of the outputs of a wireless device and the test equipment provides compensation for the delay imparted onto the test pattern by the test hardware and the wireless device according to a preferred embodiment of the present invention.

Referring now to FIG. 6, three curves display the timing diagram 600 of various data streams in a hardware BER test system and how the synchronization of the outputs of the DUT 415 and the ATE 420 provides compensation for the delay 530 imparted onto the test pattern by the test hardware and the DUT 415 according to a preferred embodiment of the present invention. A first curve 605 displays the output of the data generator 405 in a binary waveform format, a second curve 610 displays the output of the DUT 415 in a binary waveform format, and a third curve 615 displays the output of the ATE 420 in a binary waveform format. An interval 620 provides an illustration of the delay imparted on the output of the data generator 405 by the test hardware and the DUT 415 and a vertical dashed line 625 represent the time when the outputs of the DUT 415 and the ATE 420 become synchronized. As discussed previously, the delay 620 is exaggerated to simplify discussion and that the delay 620 is typically only a small fraction of the period of the output of the data generator 405.

Due to the delay 620, the data generator 405 is in the middle of the period of its output by the time the outputs of the DUT 415 and ATE 420 become synchronized. However, as discussed previously, the period of the data produced by the data generator 405 is longer than the delay, so the data generator 405 has not begun a new period.

Once the ATE 420 detects the synchronization of its output 615 and the output 610 of the DUT 415, it changes the period of its output to T1, the period of the test pattern. At anytime after it changes the period of its output, the ATE 420 can configure itself to begin outputting its copy of the test pattern and command the data generator 405 to begin outputting the test pattern as well. It is however preferred for the ATE 420 to immediately configure itself to being outputting its copy of the test pattern and issue the command to the data generator 405 to do the same. Since the outputs of the various devices only change on period boundaries, the outputs of the data generator 405 and the ATE 420 does not immediately change. When the period of data produced by the data generator 405 ends (highlight 635), it begins to output the test pattern.

However, due to the delay 620, the DUT 415 and the ATE 420 (which is synchronized to the DUT 415) is still in the middle of the current period's data. By the time the beginning of the test pattern is outputted at the output of the DUT 415 (highlight 640), the ATE 420 has completed outputting the current period's output and begins to output its own copy of the test pattern. The outputs of the DUT 415 and the ATE 420 are in synchrony and can now be compared to determine the BER of the DUT 415.

Figure 7:
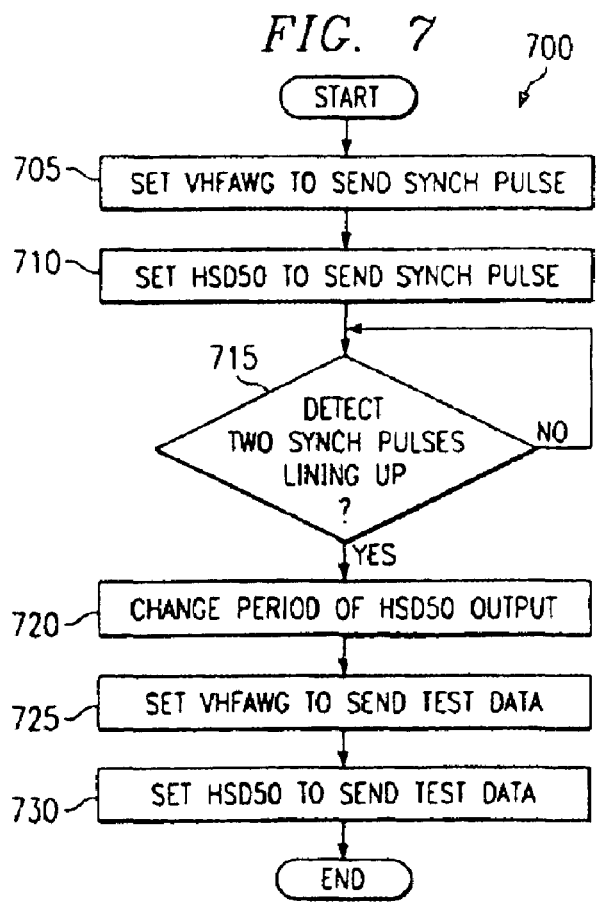
FIG. 7 illustrates a flow diagram of an algorithm used for controlling the testing system for testing the bit-error-rate of a device according to a preferred embodiment of the present invention.

Referring now to FIG. 7, a flow diagram illustrates an algorithm 700 used for controlling the hardware testing system for testing the bit-error-rate of a device according to a preferred embodiment of the present invention. According to a preferred embodiment of the present invention, the algorithm 700 executes on the ATE 420. A preferred piece of equipment for use as an ATE 420 is a HSD50 automated tester while a preferred data generator 405 is a VHFAWG (discussed previously).

The ATE 200 begins by setting the data generator 405 (the VHFAWG) to generate a periodic synchronization pulse of period T1 (block 705). According to a preferred embodiment of the present invention, the width of the pulse is significantly wider than a minimum pulse width detectable by the ATE 420. The ATE 420 also configures itself to generate a periodic synchronization pulse of period T2 (block 710). According to a preferred embodiment of the present invention, the period T1 is greater than the period T2 and is also equal to the period of the test pattern. While T2 is smaller than T1, it should be noted that T2 should be greater than the maximum expected delay imparted onto the test pattern as it propagates through the RF source 410 and the DUT 415.

Once both the ATE 420 and the data generator 405 begin generating the synchronization pulses, the ATE 420 enters a wait state where it will detect the synchronization of the two synchronization pulses. The ATE 420 remains in the wait state until it detects the two pulses in synchrony (block 715). Once the ATE 420 detects the two pulses in synchrony, the ATE 420 configures itself to change the period of the synchronization pulse to be equal to the period of the test pattern, T1 (block 720). The ATE 420 also issues a command to the data generator 405 to begin generating the test pattern at the beginning of the next period (block 725). At the same time, the ATE 420 configures itself to begin generating its own version of the test pattern (block 730). The ATE 420 and the data generator 405 continue generating the test pattern until told to stop, i.e., the BER test is complete.

According to another preferred embodiment of the present invention, the periodic synchronization pulse stream generated by the ATE 420 is of period T2, where T2 is greater than the period of the test pattern T1. As long as the period T2 is not equal to T1 or not longer than two or more periods of T1, the present invention is operable.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for synchronizing two data streams wherein the first data stream has a delay, the method comprising:
    setting a first data stream generator to output a first periodic pulse stream with its period equal to first period, T1, producing an output after the delay;
    setting a second data stream generator to output a second periodic pulse stream with its period equal to second period, T2, wherein second period, T2, is not equal in duration to first period, T1;
    detecting a time when a pulse of the delayed first pulse stream and a pulse of the second pulse stream occurs simultaneously;
    changing the period of the second pulse stream to be equal to first period, T1; and
    starting the generation of the two data streams.

2. The method of claim 1, wherein first period, T1, is greater in duration than second period, T2.

3. The method of claim 2, wherein both first period, T1, and second period, T2, are greater in duration than the delay.

4. The method of claim 1, wherein first period, T1, is smaller in duration than second period, T2.

5. The method of claim 1, wherein the synchronization pulses are of a duration that is greater than a minimum duration detectable a pulse detector.

6. The method of claim 1, wherein the changing step comprises changing the period of the second pulse stream prior to the end of the period with the detected pulse.

7. The method of claim 1, wherein the delay is smaller in duration than the duration of first period, T1.

8. The method of claim 1, wherein the starting step comprising:
    setting the first data stream generator to generate the first data stream at the end of the current period of the first periodic pulse stream; and
    setting the second data stream generator to generate the second data stream at the end of the current period of the second periodic pulse stream.

9. The method of claim 8, wherein the two data streams are periodic and the period of the first data stream is equal to first period, T1.

10. The method of claim 8, wherein the two data streams are periodic and the period of the first data stream is equal to the period of the second data stream.

11. The method of claim 1, wherein the delay is due to the pulse stream propagating through hardware.

12. The method of claim 11, wherein the hardware comprises test hardware and a device under test.

13. The method of claim 12, wherein the delay varies with different test hardware and different devices under test.

14. The method of comparing two data streams wherein one data stream is propagated through hardware and has a delay, the method comprising:
    synchronizing the start of the two data streams, wherein the synchronizing step comprising:
        setting a first data stream generator to output a first periodic pulse stream with its period equal to first period, T1, producing an output after the delay;
        setting a second data stream generator to output a second periodic pulse stream with its period equal to second period, T2, wherein the second period, T2, is not equal in duration to the first period, T1;
        detecting a time when a pulse of the delayed first pulse stream and a pulse of the second pulse stream occurs simultaneously;
        changing the period of the second pulse stream to be equal to first period, T1; and
        starting the generation of the two data streams; and
    comparing the two data streams, after starting the two data streams.

15. The method of claim 14, wherein the comparing step compares the two data streams in a bitwise fashion.

16. The method of claim 15, wherein the comparing step compares the two data streams using a binary exclusive-or logic gate.

17. The method of claim 14, wherein the hardware comprises test hardware and a device under test.

18. The method of claim 17, wherein the device under test is data device.

19. The method of claim 18, wherein the data device is a wireless data device.

20. The method of claim 18, wherein the data device is a wired data device.

21. The method of claim 14, wherein the comparison produces a logical high value when a bit in one data stream is different from a corresponding bit in the other data stream.

22. The method of claim 21, wherein the method further comprising a step of counting the output of the comparing step.

23. An apparatus for performing a comparison of two data streams wherein one data stream has a delay, the apparatus comprising:
    a first data stream generator containing circuitry to generate a first data stream;
    a second data stream generator containing circuitry to generate a second data stream;
    a controller coupled to the first and second data stream generators, the controller comprising:
    a command issue unit coupled to the first and second data stream generators, the issue unit containing circuitry to issue commands to the first and second data stream generators, controlling type and period of the data streams; and
    a synchrony detector coupled to outputs of the first and second data stream generators, the detector containing circuitry to detect the occurrence of pulses from the first and second data stream occurring simultaneously;
    a combinatorial logic unit coupled to outputs of the first and second data stream generators, the logic unit containing circuitry to perform a comparison of the first and second data streams.

24. The apparatus of claim 23, wherein the apparatus further comprising a counter coupled to the combinatorial logic unit, the counter to count the output of the combinatorial logic unit.

25. The apparatus of claim 23, wherein the combinatorial logic unit comprises:

a comparison unit coupled to the outputs of the first and second data stream generator, the comparison unit containing circuitry to compare the outputs bit-by-bit and to produce a first output when the bits are equal and a second output when the bits are different; and an enable unit coupled to the output of the comparison unit, the enable unit containing circuitry to enable and disable the output of the comparison unit.

26. The apparatus of claim 25, wherein the comparison unit comprising an exclusive-or logic gate.

27. The apparatus of claim 25, wherein the enable unit comprising a negative-and logic gate.

28. The apparatus of claim 23, wherein the apparatus is used to count the number of times bits in the two data streams are different.

29. The apparatus of claim 23, wherein the output of the first data stream generator is a delayed version of the output of a third data stream generator.

30. The apparatus of claim 29, wherein the command issue unit is further coupled to the third data stream generator, and the issue unit issues commands to the third data stream generator, controlling type and period of its output.

* * * * *